United States Patent
Kok et al.

(10) Patent No.: US 7,308,368 B2
(45) Date of Patent: Dec. 11, 2007

(54) METHOD AND APPARATUS FOR VIBRATION DETECTION, METHOD AND APPARATUS FOR VIBRATION ANALYSIS, LITHOGRAPHIC APPARATUS, DEVICE MANUFACTURING METHOD, AND COMPUTER PROGRAM

(75) Inventors: Haico Victor Kok, Eindhoven (NL); Koen Kivits, Eindhoven (NL); Ron Van De Laak, Eindhoven (NL); Hans Kuiper, Koog aan de Zaan (NL)

(73) Assignee: ASML Netherlands B.V., Veldhoven (NL)

( * ) Notice: Subject to any disclaimer, the term of this patent is extended or adjusted under 35 U.S.C. 154(b) by 31 days.

(21) Appl. No.: 10/941,019

(22) Filed: Sep. 15, 2004

(65) Prior Publication Data
US 2006/0058972 A1    Mar. 16, 2006

(51) Int. Cl.
*G06F 19/00* (2006.01)
(52) U.S. Cl. ......................... 702/56; 702/150
(58) Field of Classification Search ................. 702/56, 702/150, 151, 152, 153; 356/450, 521; 250/200, 250/558; 73/655, 657
See application file for complete search history.

(56) References Cited

U.S. PATENT DOCUMENTS

| | | | |
|---|---|---|---|
| 4,340,304 A | * | 7/1982 | Massie ......................... 356/489 |
| 5,285,258 A | * | 2/1994 | Kamon ......................... 356/401 |
| 6,278,957 B1 | | 8/2001 | Yasuda et al. |
| 6,828,540 B2 | * | 12/2004 | Landolt .................... 250/208.1 |
| 2003/0053035 A1 | | 3/2003 | Butler et al. |

FOREIGN PATENT DOCUMENTS

EP    0 969 328 A2    1/2000

OTHER PUBLICATIONS

European Search Report issued for European Patent Application No. 05108492.9-1226, dated Feb. 22, 2007.
Kazuya Ota, et al., "New Alignment Sensors for Wafer Stepper," Proceedings of SPIE Optical/Laser Microlithography, vol. 1463, 1991, pp. 304-314.

* cited by examiner

*Primary Examiner*—Bryan Bui
(74) *Attorney, Agent, or Firm*—Pillsbury Winthrop Shaw Pittman, LLP

(57) ABSTRACT

A method is provided for determining information relating to vibration. The method includes projecting an aerial image at an image position in a projection plane; mapping an intensity of the aerial image into an image map that contains values of coordinates of sampling locations and of the intensity sampled at each sampling location; and measuring intensity of the aerial image received through a slot pattern. The method may also include determining from the image map a detection position of a slope portion of the image map; at the detection position of the slope portion, measuring a temporal intensity of the aerial image and relative positions of the slot pattern and the image position; and determining from the temporal intensity of the aerial image information relating to vibration for the aerial image. The relative positions of the slot can be measured as position-related data of the slot pattern.

20 Claims, 9 Drawing Sheets

METHOD AND APPARATUS FOR VIBRATION DETECTION, METHOD AND APPARATUS FOR VIBRATION ANALYSIS, LITHOGRAPHIC APPARATUS, DEVICE MANUFACTURING METHOD, AND COMPUTER PROGRAM

FIELD OF THE INVENTION

The present invention relates to methods and apparatus for vibration detection and analysis.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning structure. It holds the patterning structure in a way depending on the orientation of the patterning structure, the design of the lithographic apparatus, and other conditions, such as for example whether or not the patterning structure is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

During exposure of a die, the image of the desired pattern is typically disturbed by a number of sources, which may include, for example, vibrations of the projection lens, temperature fluctuations of the ambient along the optical path, vibrations of the framework which encompasses the metrology devices, vibrations of other components and/or positioning errors caused e.g. by measurement errors of interferometers for positioning a stage holding the substrate.

Due to the vibration of the image during exposure, a loss of contrast in the image may occur. Such loss of contrast may result in reduced accuracy of alignment and of dimensions of (portions of) the imaged pattern. Especially, since the accuracy of alignment is within a few tens of nanometers, the possible occurrence of vibrations with an amplitude of a same order may have a strong impact on the image quality. Clearly, vibrations should be minimized.

SUMMARY

According to one embodiment, a method for determining information relating to vibration comprises projecting an aerial image at an image position in a projection plane; creating an image map of the aerial image, said image map comprising values of coordinates of sampling locations and of the intensity sampled at each sampling location; measuring intensity of the aerial image received through a slot pattern; from the image map, determining a detection position of a slope portion of the image map; at the detection position of the slope portion, measuring (A) a temporal intensity of the aerial image and (B) relative positions of the slot pattern and the image position, the relative positions of the slot pattern being measured as position-related data of the slot pattern; and from the temporal intensity of the aerial image, determining information relating to vibration for said aerial image.

According to another embodiment, an apparatus for determining information relating to vibration comprises a slot pattern; a photo-sensitive device arranged in a predetermined position relative to the slot pattern to measure intensity of an aerial image projected at an image position in a projection plane and received through the slot pattern; and a processor operatively coupled to the photo-sensitive device; a displacement device configured to displace the relative positions of the slot pattern and of the image position in a plane of projection of the aerial image; wherein said processor is configured to map an intensity of an aerial image into an image map, the image map comprising values of coordinates of sampling locations and of the intensity sampled at each sampling location, and to determine from the image map a detection position of a slope portion of the image map, and wherein said apparatus is configured to measure, at the detection position of the slope portion, (A) a temporal intensity of the aerial image and (B) relative positions of the slot pattern and the image position, the relative positions of the slot pattern being measured as position-related data of the slot pattern, and wherein said processor is configured to determine, from the temporal intensity of the aerial image, information relating to vibration for said aerial image.

A computer system according to a further embodiment is configured for use with an apparatus for determining information relating to vibration, said apparatus being configured to map an intensity of an aerial image into an image map, the image map comprising values of coordinates of sampling locations and of the intensity sampled at each sampling location, said apparatus comprising: a slot pattern; a photo-sensitive device arranged in a predetermined position relative to the slot pattern to measure intensity of an aerial image projected at an image position in a projection plane and received through the slot pattern; and a displacement device configured to displace the relative positions of the slot pattern and of the image position in a plane of projection of the aerial image; wherein said computer system is configured to determine from the image map a detection position of a slope portion of the image map, wherein said computer system is configured to measure, at the detection position of the slope portion, (A) a temporal intensity of the aerial image and (B) relative positions of the slot pattern and the image position, the relative positions of the slot pattern being measured as position-related data of the slot pattern, and wherein said computer system is configured to determine, from the temporal intensity of the aerial image, information relating to vibration for said aerial image.

According to a further embodiment, a computer program product comprises machine-executable instructions, said instructions describing a method comprising projecting an aerial image at an image position in a projection plane; creating an image map of the aerial image, said image map comprising values of coordinates of sampling locations and of the intensity sampled at each sampling location; measuring intensity of the aerial image received through a slot pattern; from the image map, determining a detection position of a slope portion of the image map; at the detection position of the slope portion, measuring (A) a temporal intensity of the aerial image and (B) relative positions of the slot pattern and the image position, the relative positions of the slot pattern being measured as position-related data of the slot pattern; and from the temporal intensity of the aerial image, determining information relating to vibration for said aerial image.

According to a further embodiment, a method of determining information relating to vibration comprises projecting an aerial image, said projected aerial image having a corresponding position in a projection plane; creating an intensity map of the projected aerial image as detected through a slot pattern, said intensity map including (A) a plurality of sampled intensity values and (B) coordinates of sampling locations corresponding to each of the plurality of sampled intensity values; determining a slope position of the intensity map, said slope position corresponding to a portion of the intensity map having a high relative change in intensity with respect to change in location; measuring (C) an intensity of the projected aerial image at the slope position at a plurality of different times and (D) relative positions of the slot pattern and the aerial image corresponding to each of said plurality of intensity measurements; and based on results of said measuring, determining information relating to vibration of said image.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

At least some embodiments of the present invention may be applied to provide a system and a method for determining vibration modes and a measure for their respective magnitude for an assembly, or more in particular, a lithographic apparatus.

Figure 1:
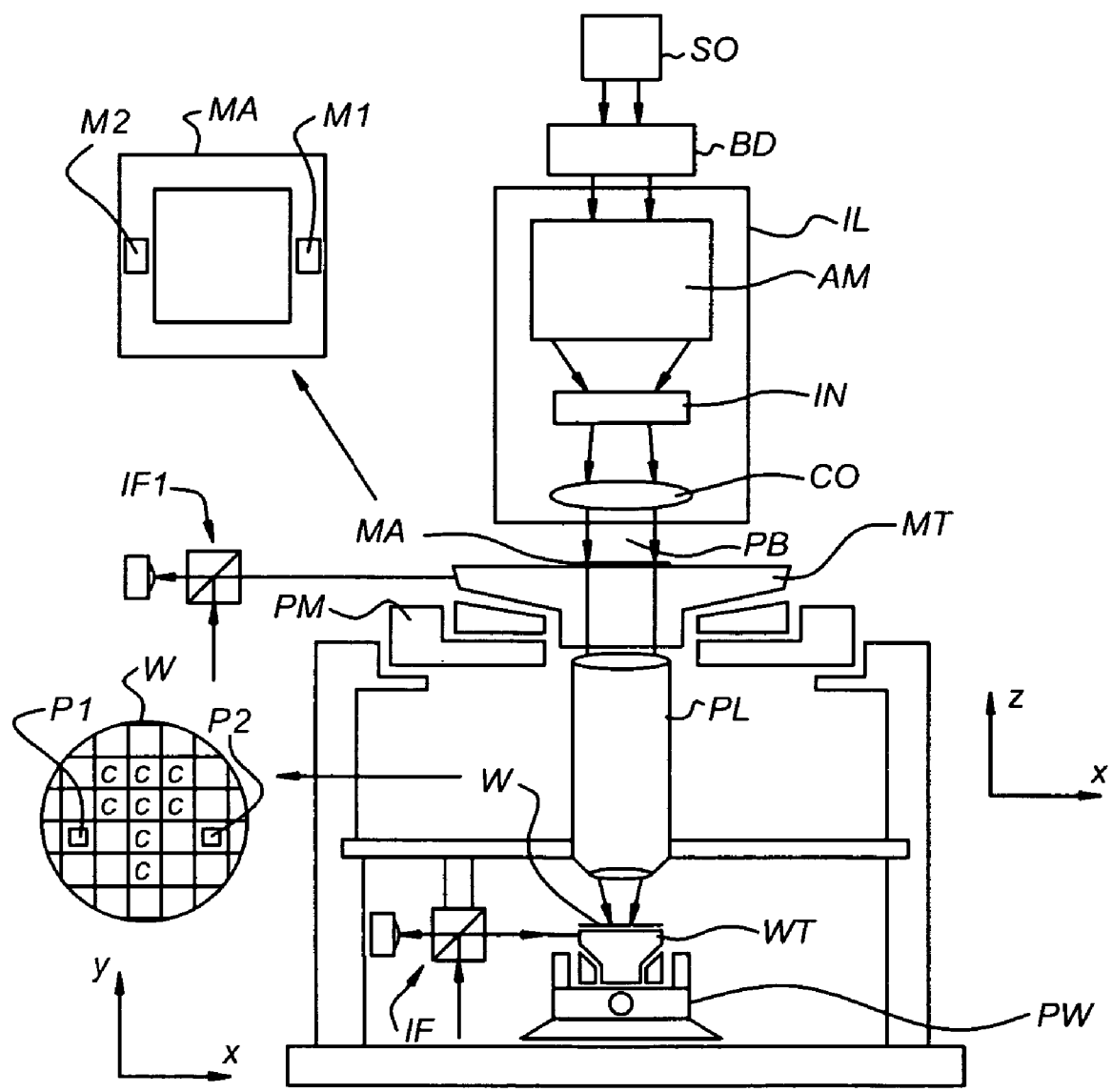
FIG. 1 depicts a lithographic apparatus according to an embodiment of the invention.

FIG. 1 schematically depicts a lithographic apparatus according to a particular embodiment of the invention. The apparatus comprises an illumination system (illuminator) IL for providing a projection beam PB of radiation (e.g. UV radiation); a first support structure (e.g. a mask table) MT for supporting patterning structure (e.g. a mask) MA and connected to a first displacement (positioning) device PM (e.g. including at least one rotary, linear, or planar motor) for accurately positioning the patterning structure with respect to item PL; a substrate table (e.g. a wafer table) WT for holding a substrate (e.g. a resist-coated wafer) W and connected to a second displacement (positioning) device PW (e.g. including at least one rotary, linear, or planar motor) for accurately positioning the substrate with respect to item PL; and a projection system (e.g. a refractive projection lens) PL for imaging a pattern imparted to the projection beam PB by patterning structure MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and measurement device (position sensor) IF (e.g. an interferometric or capacitive device and/or encoder), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
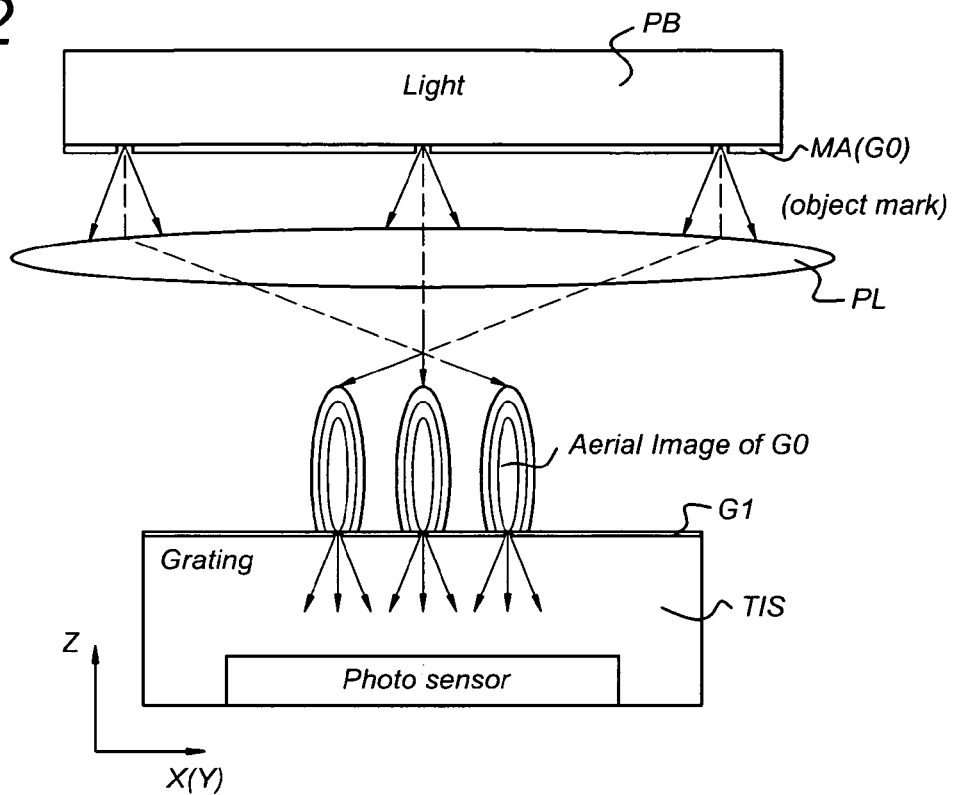
FIG. 2 depicts schematically a device for transmission image detection.

FIG. 2 depicts schematically a device for transmission image detection TIS. Implementations of such a device are known in the art. The projection beam PB is incident on a first object G0, for example a grating in the mask MA. The first grating G0 comprises a plurality of openings arranged for creating an image from the projection beam PB. The openings in the first grating G0 each emit a radiation beam RB originating from the projection beam PB.

The radiation beams emitted by the plurality of openings in G0 pass through a lens, for example, the projection lens system PL. The optical properties of such projection lens system are such that an aerial image of G0 is formed at a given plane below the projection lens system PL.

The device for transmission image detection TIS is positioned below the projection lens system PL. The device for transmission image detection TIS comprises a slot pattern G1 and a photo sensor device PS.

In its simplest form the slot pattern G1 is simply an opening over the photo sensor device PS which may have the shape of a slit or a square, but which preferably has a well defined edge. In a more advanced embodiment, the slot pattern G1 may be a second grating. In that case, the second grating G1 may be similar in shape to the first grating G0 (e.g. such that the size of G1's features is substantially equal to the size of G0's features, multiplied by the magnification factor M of the projection lens system PL). Applying a pattern on the opening over the photo sensor device PS may have the advantage of increasing the number of edges, which may improve the sensitivity of the photo sensor PS.

The device for transmission image detection TIS may be arranged for movement relative to the position of the projection lens system PL and the mask MA in three orthogonal directions X, Y, and Z (e.g. via movement of a stage carrying the device).

By scanning along these three directions the intensity of the aerial image can be mapped as a function of the XYZ position of the device for transmission image detection TIS, for example in an image map (a 3D map), which comprises the coordinates of sampling locations and the intensity sampled at each location. During this procedure, the aerial image may be projected using a relatively large depth of focus, e.g. different from the depth of focus during exposure of the mask image on a substrate.

In practice, the TIS may comprise at least two slot patterns G1, one arranged in the X-direction and the other arranged in the Y-direction for simultaneous image detection in both X and Y directions. In this situation, at least two first gratings G0 are arranged at the MA level, one arranged in the X-direction and the other arranged in the Y-direction, for simultaneous image creation in both X and Y directions.

From the 3D map, computational equipment connected to the device for transmission image detection TIS can derive the position of the aerial image by for example a parabolic fit of the top position (see FIG. 4) using a least squares fitting method. Such computational equipment may be a processor in either a dedicated processing device, a controller system or a (general purpose) computer system, as known to persons skilled in the art.

Figure 11:
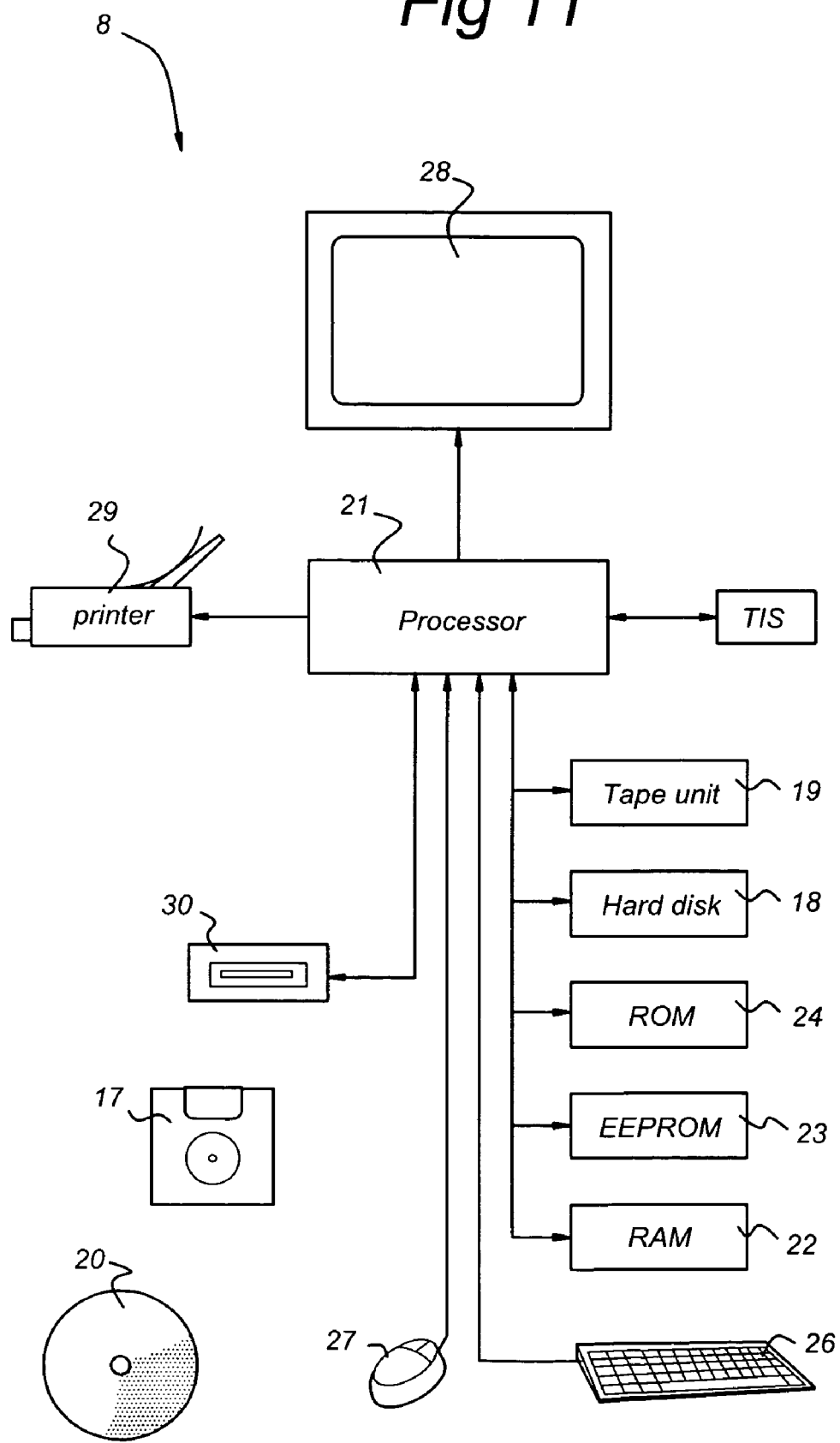
FIG. 11 shows a schematic diagram of computational equipment for use in an embodiment of the present invention.

FIG. 11 provides an example of computational equipment arranged for determining a position of an aerial image and/or for performing the method according to an embodiment of the present invention.

Figure 3:
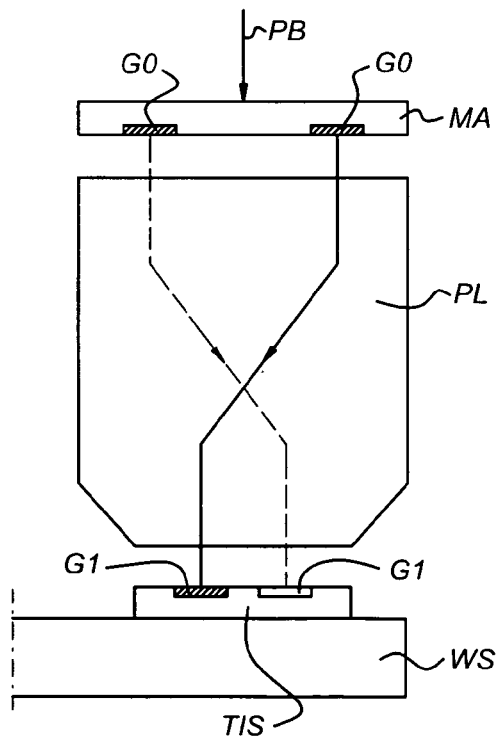
FIG. 3 depicts schematically an alignment operation using the device for transmission image detection.

FIG. 3 depicts schematically an example of an alignment operation using the device for transmission image detection TIS. During this operation, a mask MA is aligned with respect to the device for transmission image detection TIS which is located at a known position in the wafer stage WS. The optical path OP for each first grating G0 to the corresponding slot pattern G1 is schematically depicted. It may be desirable for the alignment procedure to take place while using the same illumination source as for exposure of dies.

Figure 4A:
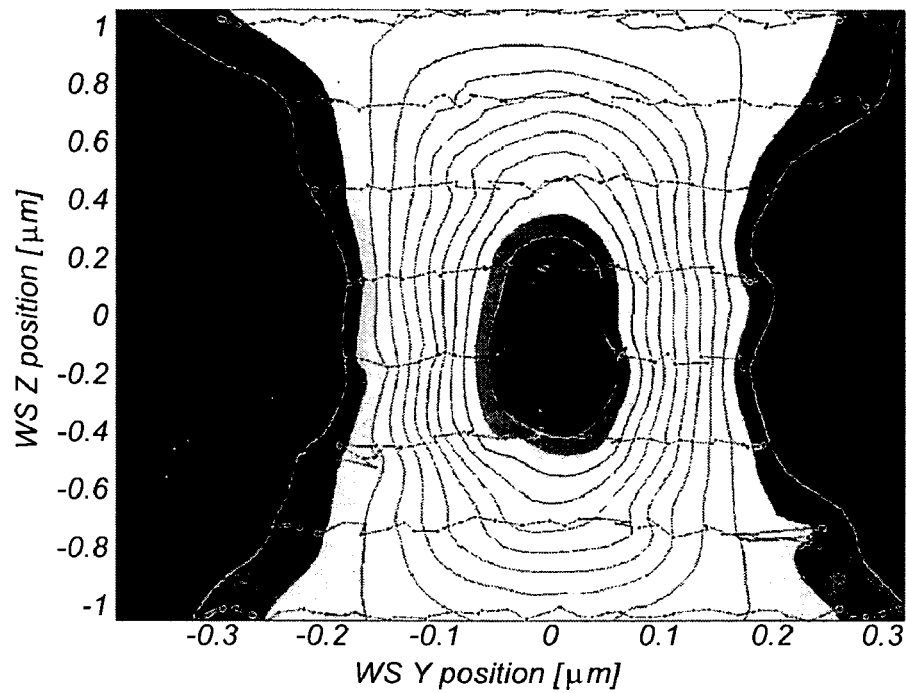
FIGS. 4a and 4b depict an exemplary intensity distributions of an aerial images detected by the device for transmission image detection in a contour plot and a 3D plot, respectively.
Figure 4B:
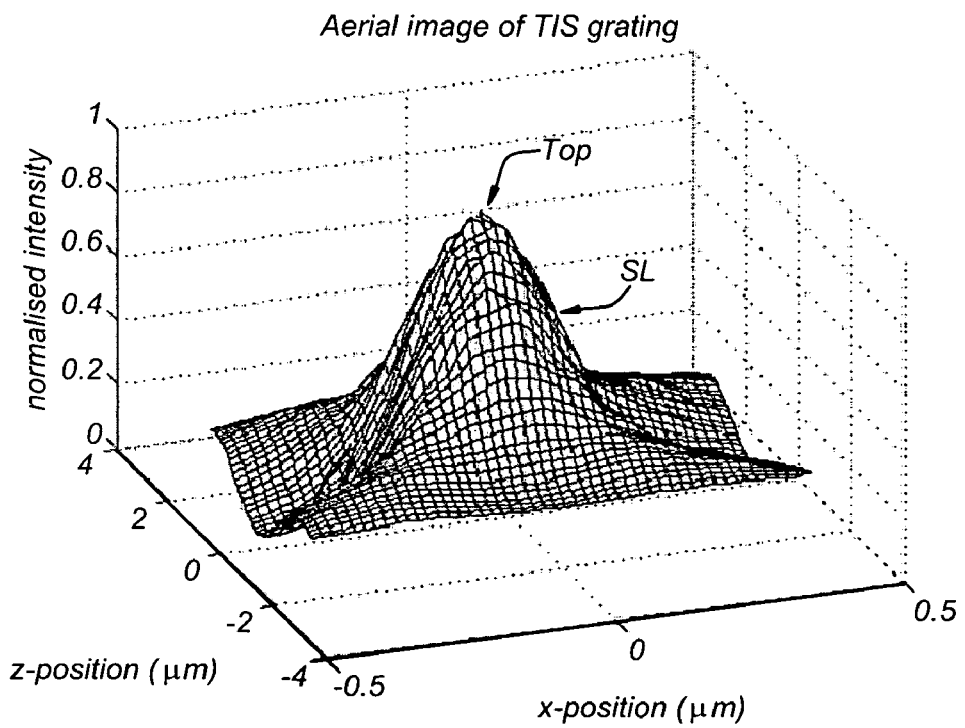

FIGS. 4a and 4b depict an exemplary intensity distributions of an aerial images detected by the device for transmission image detection TIS in a contour plot and a 3D plot, respectively.

The contour plot of FIG. 4a displaying the intensity distribution in the Y-Z plane (i.e., at a fixed X position) is compiled by scanning of the X-Y-surface for a number of different Z positions of the receiving second grating G1. The scan paths are shown as solid lines with dots indicating the measured wafer stage positions. The X, Y, Z positions are wafer stage positions (as measured e.g. by interferometry). As one can see from the scan paths, the measurement positions which were intended to be on an orthogonal grid, appear to be somewhat random. This is due to vibrations in the system.

The 3D plot of FIG. 4b is a modified representation of data representing an intensity distribution in the X-Z plane by plotting the TIS measured intensity as third parameter along the z-axis of the plot.

From the data of FIG. 4a and/or FIG. 4b, the aligned position can be derived by fitting the shape of the measured aerial image to a model. Typically the aligned position is derived by a parabolic fit on the top TOP of the aerial image peak (as shown in FIG. 4b). As known to persons skilled in the art, alternative methods for fitting data such as a Gaussian fit or a least squares fit may be used as well.

Also, in FIG. 4b a slope SL of the aerial image intensity is schematically indicated. The slope SL will be discussed in more detail below.

Figure 5:
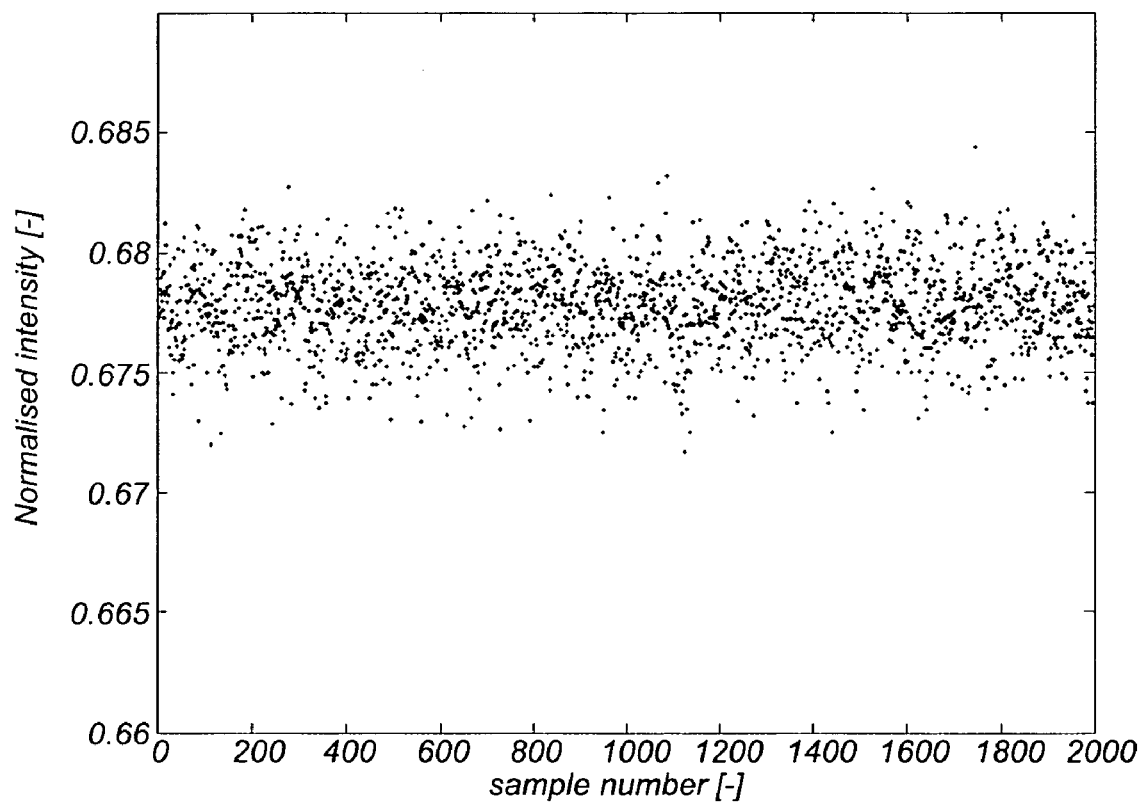
FIG. 5 shows an exemplary measurement of a static scan of the top intensity of an aerial image.

FIG. 5 shows an exemplary measurement of a static scan of the intensity of an aerial image at the top intensity position TOP. In FIG. 5, the measured intensity is presented versus sample number.

The graph of FIG. 5 shows the measured intensity variation of a static scan (i.e., sampling without making a scan, although a scan over a very short range may be an option here) on the top of the aerial image. Such intensity variations are normally not related to stage variations, due to the large insensitivity of position variations on top of a parabola. The measured intensity variations are usually due to noise contribution of the sensor.

As one can see, the intensity varies randomly by a few percent during this sequence. It will be understood that such variation of the intensity may complicate the determination of an aligned position from intensity scans using basically the top of the aerial image. This method is rather insensitive for slight position changes, as the top of the fitted parabola is rather flat.

Figure 6A:
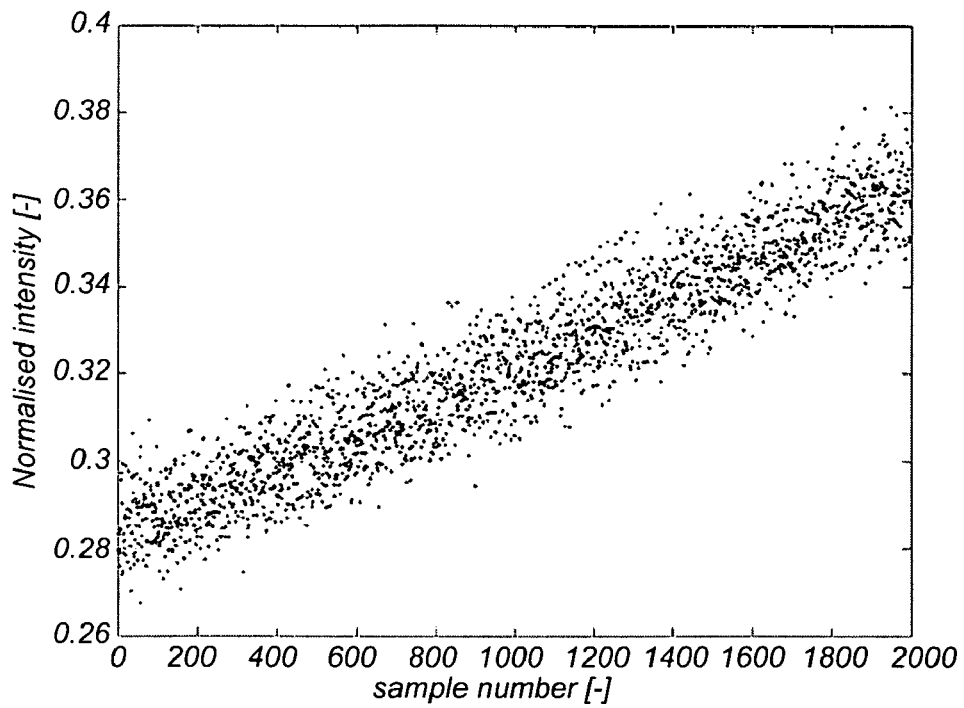
FIGS. 6a and 6b show an example of a measurement of a slope intensity of an aerial image and a simultaneous stage position measured by interferometer in a further sampling sequence, respectively.
Figure 6B:
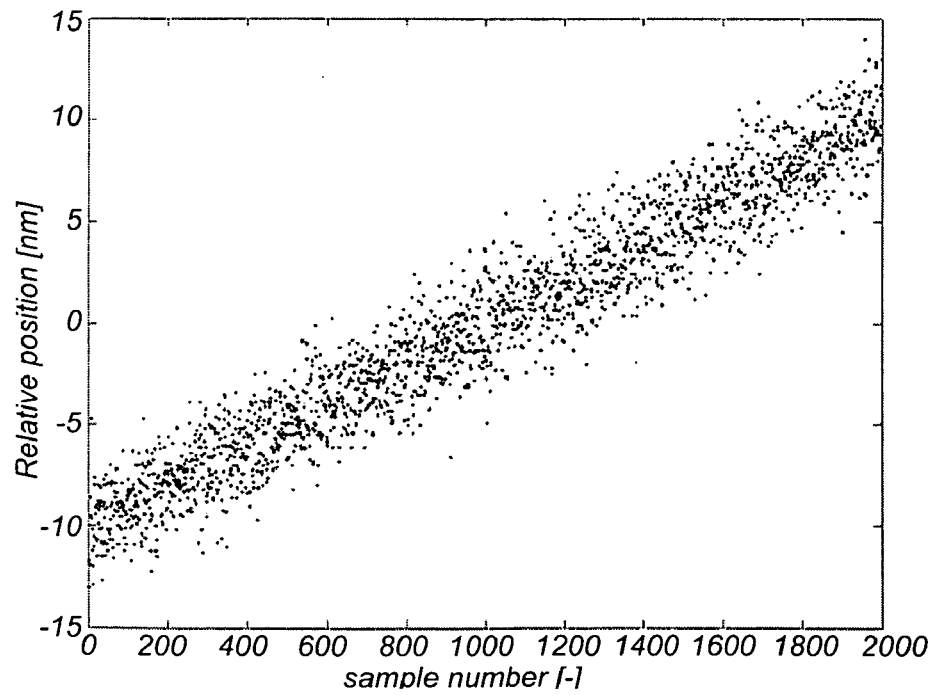

FIGS. 6a and 6b show an example of a measurement of a slope intensity of an aerial image and a simultaneous stage position (measured e.g. by interferometer) in a further sampling sequence, respectively.

The wafer stage position measurement by interferometer (s) is independent from the measurements by TIS. It is however possible to correlate interferometer measurements with aerial image position measurements from TIS.

In an embodiment, the correlation method is carried out as follows:

The shape of the aerial image is determined in a "normal" TIS scan as done in the normal use of TIS, e.g. as described above or as otherwise known in the art. From the "normal" TIS scan the top and slope positions of the aerial image are known. The slope position SL can be defined in various ways as known to the person skilled in the art, for example as the position corresponding to substantially half the width of the aerial image peak.

After this first "normal" determination of the shape of the aerial image's intensity, by scanning its top TOP and its slope position SL, the device for transmission image detection TIS is arranged for measurements on the slope position SL of the 3D plot of the aerial image.

From the determination of the shape of the aerial image in the first normal determination, the position of the slope SL (at substantially half-width of the aerial image peak) is roughly known (estimated). The intensity measurement on the slope position SL is then performed with the aerial image being in focus on G1 at the slope position SL of the aerial image as presented in FIG. 4b.

In case of a vibration measurement in the focus direction the slope scan is performed at substantially horizontally aligned positions and at the slope position in vertical direction to gain maximum sensitivity in the focus direction. The illumination settings may also be changed to influence the sensitivity of the measurement on the slope position SL.

Note that the slope coefficient at the slope position SL can be determined in various ways.

In one embodiment the aerial image remains at a fixed position (slope position SL) relative to the device for transmission image detection TIS without scanning. In this case the determination makes use of the variation of the intensity due to vibrations.

In a further embodiment, the measured position of aerial image varies around the slope position SL by a scanning operation of the device for transmission image detection TIS. In this case the determination makes use of the variation of the intensity due to the shape of the aerial image. Such scans are typically over a short range around the slope position SL, which has typically, a scan length of about 20 nm.

Note that a movement of the image relative to the photo sensor PS in the wafer stage WS may not be equal to a movement of the wafer stage WS. Because of the magnification factor M of the projection lens system PL, for example, movements of the wafer stage WS may be 1/M of corresponding movements of the reticle stage (i.e., mask table MT).

Next, the device for transmission image detection TIS carries out a number of intensity measurements at and/or near the slope position SL of the aerial image peak. Due to the relative steepness of the slope, the sensitivity is relatively large: a small change of measurement position (due to vibration or scanning) relates to a relatively large change of the measured intensity.

FIG. 11 shows an example of computational equipment arranged for performing operations in accordance with a method according to an embodiment of the present invention.

FIG. 6a shows the measured (normalized) intensity of the aerial image in the vicinity of the slope position of the image as a function of the sample number (i.e., the number of the respective measurement during the scan). Clearly, the slope of the image is visible in the data, despite a relatively large scatter (of about 5-10%).

During the intensity measurements on the slope SL, simultaneous interferometer measurements for determining the X (and/or Y) position of the wafer stage WS are carried out. These measurements of an interferometer position signal as a function of the sample number during the intensity measurements on the slope are shown in FIG. 6b.

Depending on the implementation of the TIS detector (vibration or scan direction: X, Y or vibration or scan plane XY) and the available interferometers (in X, Y and/or Z direction), vibration measurements can be made in the single X- or Y-direction, the XY-plane or in the Z-direction.

Figure 7:
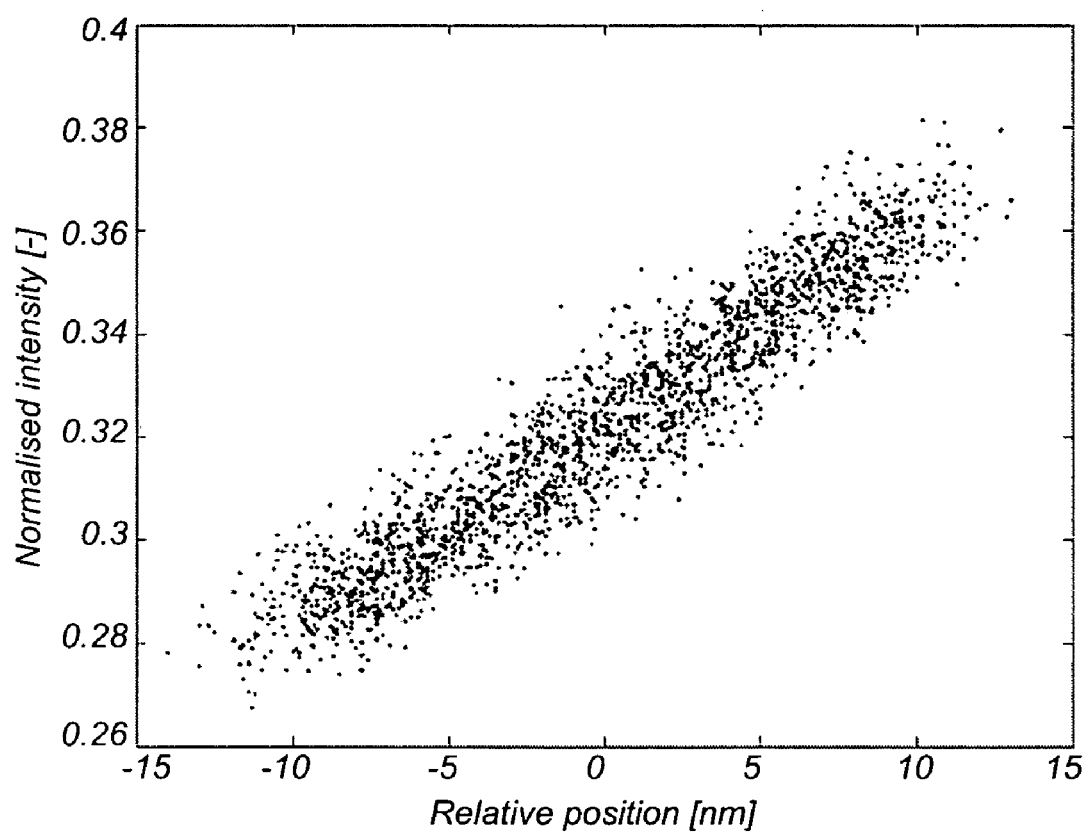
FIG. 7 shows a plot of the slope intensity vs. measured stage position for the measurements of FIGS. 6a and 6b.

FIG. 7 shows a plot of the measured intensity versus stage position of the slope measurements that are presented in FIGS. 6a and 6b;

In FIG. 7 the measured intensity for each sample number is plotted as a function of the interferometer determined wafer stage position for the respective sample number.

The relation between measured intensity during a plurality of "intensity measurements on the slope" and wafer stage position is clearly shown: on the slope of the aerial image the intensity varies substantially in a linear way with a small change of the wafer stage position. A mean wafer stage position is indicated by '0' on the horizontal axis. By calculation of the correlation (coefficients), the sensitivity relation between wafer stage position and measured intensity of the aerial image of grating G0 can be determined with relatively high accuracy. The sensitivity relation (normally linear behavior) is used to transform the measured intensity data by TIS into position data. In this way two independent position measurements, i.e., one by the TIS detector and one by the interferometer(s), can be compared. Since TIS and the interferometers use different light paths there is a different sensitivity for system vibrations.

The TIS and stage position data may be transferred into power spectral densities e.g. by means of a Fourier analysis. All system vibrations are applicable to the aerial image, for example as seen during the exposure of a substrate C, whereas the interferometers only measure stage vibrations.

Figure 8:
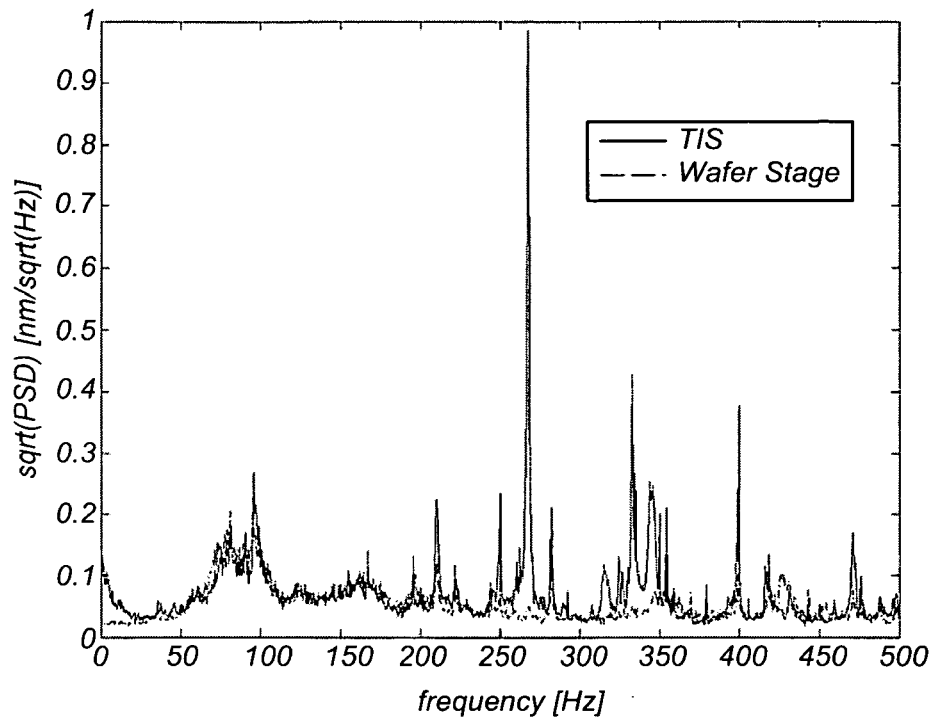
FIG. 8 shows spectral density plots for intensity measurements on the slope of an aerial image and for simultaneous stage position measurements as a function of frequency.

FIG. 8 shows an example of power spectra of the TIS and wafer stage position data as measured by the interferometers. The spectra show only a partial similarity, due to the different sensitivity of the respective measurements on system frequencies. The determination of an aligned position by the transmission image sensor TIS is insensitive to stage vibrations, since stage vibrations are also present in the aerial image and have been taken into account by the least square fit (as discussed with reference to FIG. 4).

Causes of performance reduction may be limited to those vibrations that appear on only one of the sensors. The power spectrum that shows vibrations related to the performance of only the transmission image sensor TIS is obtained from the difference between the power spectra as measured by the TIS and the wafer stage position, respectively, with phase differences taken into account.

Figure 9:
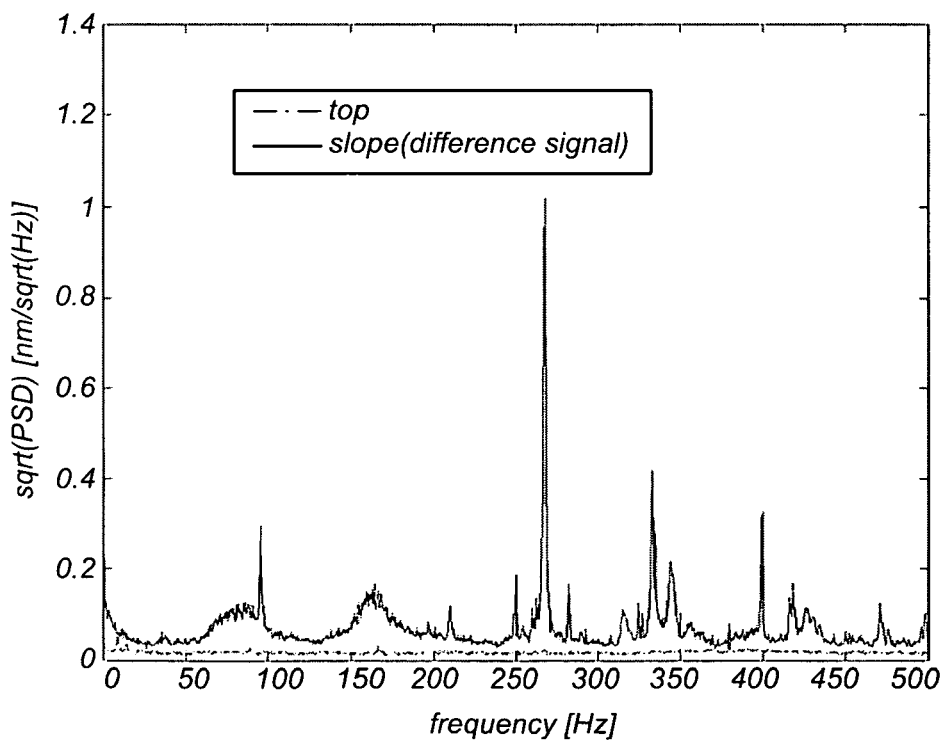
FIG. 9 shows spectral density plots for intensity measurements on top and slope of an aerial image as a function of frequency.

FIG. 9 shows an example of the power spectrum of a top measurement by the TIS and the difference signal of a slope measurement by the TIS.

The power spectra of FIGS. 8 and 9 can be determined for each of the X, Y and Z directions. Since a distinction can be made between light path and measuring direction, system vibrations can be related to both position and frequency. Such system vibrations comprise, for example, short-cuts, wavelength variations, lens vibrations, temperature fluctuations of air, metroframe vibrations (i.e., of frame on which metrology system is mounted) and vibrations of other components, interferometer measurement errors etc.

The intensity measurements on the slope by the device for transmission image detection TIS can be used as a tool for vibration detection in a lithographic apparatus during installation. Additionally, the method can provide a tool for detection of vibration-related process anomalies such as for example, micro-bridging of sub-micron features in semiconductor devices. Also, the tool may be used for preventive maintenance by obtaining data which may be monitored for some maintenance-related characteristics, for example, a change of the relative intensity of some frequency (frequencies) in a vibration frequency spectrum, or a shift of a vibration frequency. The preventive maintenance may be carried out in some automatic mode, e.g. by the computation equipment of the lithographic apparatus (cf. FIG. 11) and/or by a remote computation system over some data-link via a supervising network.

System vibrations can be determined in the time domain, besides in the frequency domain as discussed previously, by the slope measurement to analyze intermittent effects. In power spectra the intermittent effects are averaged and do not yield the maximum disturbance as observed by the system due to the vibrations.

Figure 10:
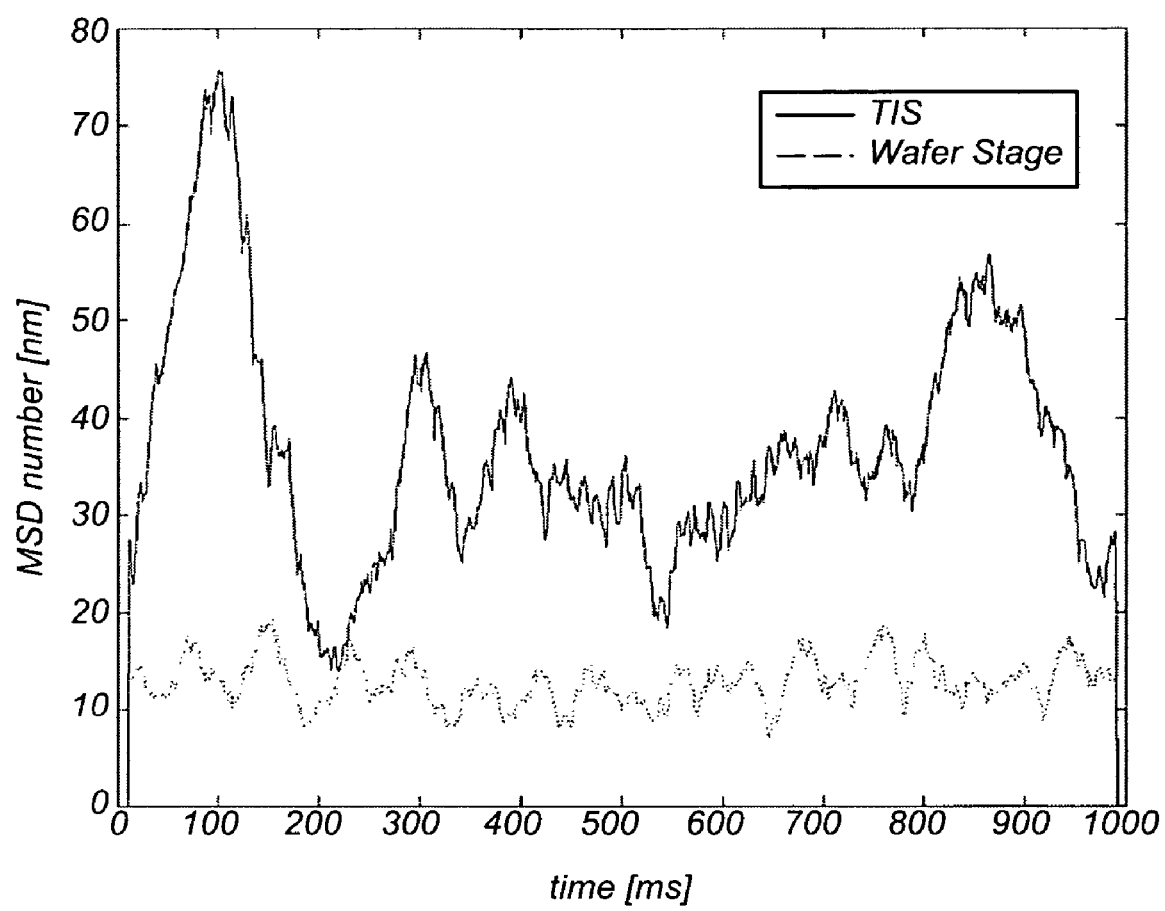
FIG. 10 shows moving standard deviation plots for intensity measurements on the slope of an aerial image and for simultaneous stage position measurements as a function of time.

FIG. 10 shows moving standard deviation (MSD) plots for TIS position and interferometer position signals on the slope of an aerial image as a function of time. In a comparison between TIS position and interferometer position signals (indicated with "wafer stage") clearly a larger contribution of system vibrations is observed in the TIS position signal (aerial image), which vibrations are not constant in time.

The length of a MSD filter (range over which the moving standard deviation is determined) can be taken identical to the specific exposure time of a substrate portion C. The maximum MSD number of the TIS position signal of the slope measurement then gives a qualification of contrast, for example of a lithographic system. Moreover, the maximum TIS MSD number can be used as a qualification specification for contrast of a feature in a pattern (e.g., a dot, line or block) for a lithographic system.

Finally, the method for qualifying the contrast of such a feature in a pattern on a lithographic apparatus according to the present invention can be correlated to a modulation transfer function (MTF) contrast budget of a system such as a lithographic apparatus.

As known by the skilled person, an overall modulation transfer function MTF for an optical system results from a multiplication of the contributions for all subsystems of the lithographic apparatus in the Fourier spatial domain.

The lithographic apparatus comprises a plurality of subsystems, such as the subsystem for positioning wafer stage and/or reticle stages, and other subsystems such as the optical subsystem, the wafer transport subsystem, a reticle exchanger subsystem, the illumination subsystem, etc. Each of these subsystems may contribute (in some way) to the generation of vibrations.

The integral MTF (or an MTF of some portion of the apparatus) may be determined by a method according to an embodiment of the present invention.

Optical vibrations reduce the contrast during transfer of information along the optical path. Optical vibrations may relate to alignment, imaging tolerances, optical quality of components, pupil sizes, and so on. The optical contributions are measurable as known to persons skilled in the art by a wavefront interferometer sensor device, independently from the vibration-related measurements by the device for transmission image detection TIS.

By a first measurement for the optical contributions, the MTF contrast budget can be deconvoluted. It can be compared and correlated with a second measurement for the vibration-related contributions as measured by the method according to the present invention.

Deliberately, noise can be injected into the system via artificial interfaces to study the effects on the proposed analysis methods on its sensitivity and for qualification of the methods. The injected noise can be for example, sinus sweeps, random noise sweeps or pink noise.

FIG. 11 shows schematically a computer system for performing the method according to the present invention.

Computer system 8 comprises host processor (computing device) 21 with peripherals. The host processor 21 is connected to one or more memory units 18, 19, 22, 23, 24 which store instructions and data, one or more reading units 30 (to read, e.g., floppy disks 17, CD ROM's or DVD's 20, etc.), a keyboard 26 and a mouse 27 as input devices, and as output devices, a monitor 28 and a printer 29. Other input devices, like a trackball, a touch screen or a scanner, as well as other output devices may be provided.

The memory units shown comprise RAM 22, (E)EPROM 23, ROM 24, tape unit 19, and hard disk 18. However, it should be understood that there may be provided more and/or other memory units known to persons skilled in the art. Additionally, one or more of them may be physically located remote from the processor 21, if needed.

The processor 21 is shown as one box, however, it may comprise several processing units functioning in parallel or controlled by one main processor. The processing units may be located remotely from one another, as is known to persons skilled in the art, for example in a network topology.

The computer system 8 is connected to the transmission image detection system TIS. The connection between the computer system 8 and the transmission image detection system TIS may be arranged over a network (not shown). The network may be a local area network, or a wide area network, including telecommunication networks.

The computer system 8 shown in FIG. 11 is arranged to perform the steps of the method of the present invention as described above: i.e., it may control the scanning procedure as well as carry out the data processing on the data collected by the measurements.

The connection of the computer system to the transmission image detection system TIS may be embodied in any way known to persons skilled in the art, e.g., by wire or wireless.

The processor 21 of computer arrangement 8 is capable of executing software code that implements the method for vibration detection and vibration analysis by the device for transmission image detection TIS in accordance with one or more embodiments of the present invention.

One embodiment of the invention includes a method for vibration-related information determination by means of projecting an aerial image at an image position in a projection plane; mapping an intensity of the aerial image into an image map, the image map arranged for comprising values of coordinates of sampling locations and of the intensity sampled at each sampling location; measuring intensity of the aerial image received through a slot pattern, wherein the method further comprises: determining from the image map a detection position of a slope portion of the image map; at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for said aerial image.

From the determination of vibration modes such a method derives how to improve transmission image sensing and sensing of alignment between reticle and substrate. This method is applicable both for diagnostics and troubleshooting as well as for purposes of a contrast qualification test.

Another embodiment includes an apparatus for vibration-related information determination of an aerial image being projected at an image position in a projection plane, and arranged for mapping an intensity of an aerial image into an image map, the image map arranged for comprising values of coordinates of sampling locations and of the intensity sampled at each sampling location; the apparatus comprising a slot pattern, a photo-sensitive device and a computer system connected to the photo-sensitive device, the photo-sensitive device being arranged in a predetermined position relative to the slot pattern for measuring intensity of the aerial image received through the slot pattern; the apparatus being arranged for displacing the relative positions of the slot pattern and the image position in the projection plane; wherein the apparatus for vibration-related information determination is arranged to perform: determining from the image map a detection position of a slope portion of the image map; at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for said aerial image.

A further embodiment includes a lithographic apparatus comprising an illumination system for providing a projection beam of radiation; a support structure for supporting patterning structure, the patterning structure serving to impart the projection beam with a pattern in its cross-section; a substrate table for holding a substrate; a projection system for projecting the patterned beam onto a target portion of the substrate, and an apparatus for vibration-related information determination of an aerial image being projected at an image position in a projection plane, and arranged for mapping an intensity of an aerial image into an image map, the image map arranged for comprising values of coordinates of sampling locations and of the intensity sampled at each sampling location; the apparatus comprising a slot pattern, a photo-sensitive device and a computer system connected to the photo-sensitive device, the photo-sensitive device being arranged in a predetermined position relative to the slot pattern for measuring intensity of the aerial image received through the slot pattern; the apparatus being arranged for displacing the relative positions of the slot pattern and the image position in the projection plane; wherein the apparatus for vibration-related information determination is arranged to perform: determining from the image map a detection position of a slope portion of the image map; at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for said aerial image.

A further embodiment includes a device manufacturing method comprising providing a substrate; providing a projection beam of radiation using an illumination system; using patterning structure to impart the projection beam with a pattern in its cross-section; projecting the patterned beam of radiation onto a target portion of the substrate, and determining vibration-related information by means of: projecting an aerial image at an image position in a projection plane; mapping an intensity of the aerial image into an image map, the image map arranged for comprising values of coordinates of sampling locations and of the intensity sampled at each sampling location; measuring intensity of the aerial image received through a slot pattern, wherein the method further comprises: determining from the image map a detection position of a slope portion of the image map; at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for said aerial image.

A further embodiment includes a computer system for use in an apparatus for vibration-related information determination of an aerial image being projected at an image position in a projection plane, and arranged for mapping an intensity of an aerial image into an image map, the image map arranged for comprising values of coordinates of sampling locations and of the intensity sampled at each sampling location; the apparatus comprising a slot pattern, a photo-sensitive device and a computer system connected to the photo-sensitive device, the photo-sensitive device being arranged in a predetermined position relative to the slot pattern for measuring intensity of the aerial image received through the slot pattern; the apparatus being arranged for displacing the relative positions of the slot pattern and the image position in the projection plane; wherein the computer system is arranged to enable the apparatus for vibration-related information determination to perform: determining from the image map a detection position of a slope portion of the image map; at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for said aerial image.

A further embodiment includes a computer program product to be loaded by a computer system for use in an apparatus for vibration-related information determination of an aerial image being projected at an image position in a projection plane, and arranged for mapping an intensity of an aerial image into an image map, the image map arranged for comprising values of coordinates of sampling locations and of the intensity sampled at each sampling location; the apparatus comprising a slot pattern, a photo-sensitive device and the computer system connected to the photo-sensitive device, the photo-sensitive device being arranged in a predetermined position relative to the slot pattern for measuring intensity of the aerial image received through the slot pattern; the apparatus being arranged for displacing the relative positions of the slot pattern and the image position in the projection plane; wherein the computer program product after being loaded allows the computer system to carry out: determining from the image map a detection position of a slope portion of the image map; at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for said aerial image.

Another embodiment includes an apparatus for transmission image detection as described herein, wherein the apparatus for transmission image detection is a subsystem of an optical system, the optical system comprising further optical subsystems, and the use includes deriving a subsystem contribution of the vibration-related information for the aerial image for a modulation transfer function of the optical system, the modulation transfer function comprising further contributions for the further optical subsystems of the optical system.

A further embodiment relates to a use of an apparatus for transmission image detection as described above, wherein the optical system is a lithographic apparatus.

Another embodiment relates to a use of an apparatus for transmission image detection as described above, as a preventive maintenance tool, either by monitoring by the computer system or by a remote system over a supervising network.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The description is not intended to limit the invention.

What is claimed is:

1. A method for determining information relating to vibration, said method comprising:
   projecting an aerial image at an image position in a projection plane;
   creating an image map of the aerial image, said image map comprising values of coordinates of sampling locations and of the intensity sampled at each sampling location;
   measuring intensity of the aerial image received through a slot pattern;
   from the image map, determining a detection position of a slope portion of the image map;
   at the detection position of the slope portion, measuring (A) a temporal intensity of the aerial image and (B) relative positions of the slot pattern and the image position, the relative positions of the slot pattern being measured as position-related data of the slot pattern;
   from the temporal intensity of the aerial image, determining information relating to vibration for said aerial image; and
   storing or making available the information relating to vibration for use in further processing.

2. The method for determining information relating to vibration according to claim 1, wherein said measuring relative positions of the slot pattern and the image position comprises sampling over a scanning range, the scanning range being defined by controlling a displacement of the relative positions of the slot pattern and the image position.

3. The method for determining information relating to vibration according to claim 1, wherein said measuring a temporal intensity of the aerial image comprises sampling at a fixed time interval.

4. The method for determining information relating to vibration according to claim 1, wherein the information relating to vibration for said aerial image comprises time-domain vibration data.

5. The method for determining information relating to vibration according to claim 1, wherein the information relating to vibration for said aerial image comprises frequency-domain vibration data.

6. The method for determining information relating to vibration according to claim 1, wherein said method comprises further processing of the information relating to vibration.

7. The method for determining information relating to vibration according to claim 6, wherein said further processing comprises calculating a time-based moving standard deviation as a measure of quality of the aerial image.

8. The method for determining information relating to vibration according to claim 6, wherein said further processing comprises calculating a correlation between the information relating to vibration and the position-related data of the slot pattern.

9. The method for determining information relating to vibration according to claim 6, wherein said further processing comprises deriving, based on the information relating to vibration, a modulation transfer function of an optical system.

10. The method for determining information relating to vibration according to claim 9, wherein said further processing comprises deriving, based on the information relating to vibration, a modulation transfer function of a projection system of a lithographic apparatus.

11. The method for determining information relating to vibration according to claim 9, said method comprising monitoring performance of an optical system over time, based on values derived from the information relating to vibration.

12. The apparatus for determining information relating to vibration according to claim 1, wherein said aerial image corresponds to a first grating, and
   wherein the slot pattern comprises a second grating.

13. A method for determining information relating to vibration, said method comprising:
   projecting an aerial image at an image position in a projection plane;
   creating an image map of the aerial image, said image map comprising values of coordinates of sampling locations and of the intensity sampled at each sampling location;
   measuring intensity of the aerial image received through a slot patern;
   from the image map, determining a detection position of a slope portion of the image map;
   at the detection position of the slope portion, measuring (A) a temporal intensity of the aerial image and (B) relative positions of the slot pattern and the image position, the relative positions of the slot pattern being measured as position-related data of the slot pattern;
   from the temporal intensity of the aerial image, determining information relating to vibration for said aerial image;
   using patterning structure to impart a beam of radiation with a pattern in its cross-section; and
   based on the information relating to vibration, projecting the patterned beam of radiation onto a target portion of a substrate.

14. An apparatus for determining information relating to vibration, said apparatus comprising:
   a slot pattern;
   a photo-sensitive device that measures intensity of an aerial image projected at an image position in a projection plane and received throuhg the slot pattern; and
   a processor operatively coupled to the photo-sensitive device;
   a displacement device configured to displace the relative positions of the slot pattern and of the image position in a plane of projection of the aerial image;
   wherein said processor is configured to map an intensity of an aerial image into an image map, the image map comprising values of coordinates of sampling locations and of the intensity sampled at each sampling location, and to determine from the image map a detection position of a slope portion of the image map, and wherein said appartus is configured to measure, at the detection position of the slope portion, (A) a temporal intensity of the aerial image and (B) relative position of the slot pattern and the image position, the relative positions of the slot pattern being measured as position-related data of the slot pattern, and wherein said processor is configured to determine, from the temporal intensity of the aerial image, information relating to vibration for said aerial image.

15. The apparatus for determining information relating to vibration according to claim 14, said apparatus comprising:
a support structure configured to support patterning structure, the patterning structure serving to impart a beam of radiation with a pattern in its cross-section;
a substrate table configured to hold a substrate; and
a projection system configured to project the patterned beam onto a target portion of the substrate,
wherein said projection system is configured to project the aerial image at the image position in the projection plane.

16. A computer system configured for use with an apparatus for determining information relating to vibration, said apparatus being configured to map an intensity of an aerial image into an image map comprising values of coordinates of sampling locations and of the intensity sampled at each sampling location, said apparatus comprising a slot pattern, a photo-sensitive device arranged in a predetermined position relative to the slot pattern to measure intensity of an aerial image projected at an image position in a projection plane and received through the slot pattern, and a displacement device configured to displace the relative positions of the slot pattern and of the image position in a plane of projection of the aerial image,
said computer system being configured to determine from the image map a detection position of a slope portion of the image map,
said computer system being configured to measure, at the detection position of the slope portion, (A) a temporal intensity of the aerial image and (B) relative position of the slot pattern and the image position, the relative positions of the slot pattern being measured as position-related data of the slot pattern, and
said computer system being configured to determine, from the temporal intensity of the aerial image, information relating to vibration for said aerial image.

17. A computer program product embedded in a computer readable medium comprising machine-executable instruction, said instructions describing a method comprising:
projecting an aerial image at an image position in a projection plane;
creating an image map of the aerial image, said image map comprising values of coordinates of sampling locations and of the intensity sampled at each sampling location;
measuring intensity of the aerial image received through a slot pattern;
from the image map, determining a detection position of a slope portion of the image map;
at the detection position of the slope portion, measuring (A) a temporal intensity of the aerial image and (B) relative positions of the slot pattern and the image position, the relative positions of the slot pattern being measured as position-related data of the slot pattern;
from the temporal intensity of the aerial image, determining information relating to vibration for said aerial image; and
storing or making available the information relating to vibration for use in further processing.

18. The computer program product according to claim 17 wherein the computer program product comprises a data storage medium.

19. A method of determining information relating to vibration, said method comprising:
projecting an aerial image, said projected aerial image having a corresponding position in a projection plane;
creating an intensity map of the projected aerial image as detected through a slot pattern, said intensity map inlcuding (A) a plurality of sampled intensity values and (B) coordinates of sampling locations corresponding to each of the plurality of sampled intensity values;
determining a slope position of the intensity map, said slope position corresponding to a portion of the intensity map having a high relative change in intensity with repect to change in location;
measuring (C) an intensity of the projected aerial image at the slope position at a plurality of different times and (D) relative positions of the slot pattern and the aerial image corresponding to each of said plurality of intensity measurements;
based on result of said measuring, determining information relating to vibration of said image; and
storing or making available the information relating to vibration for use in further processing.

20. The method of determining information relating to vibration according to claim 19, wherein said measuring an intensity of the projected aerial image at the slope position comprises measuring an intensity of the projected aerial image at a plurality of locations within a region corresponding to a portion of the intensity map having a high relative change in intensity with respect to change in location.

* * * * *

UNITED STATES PATENT AND TRADEMARK OFFICE
CERTIFICATE OF CORRECTION

PATENT NO. : 7,308,368 B2
APPLICATION NO. : 10/941019
DATED : December 11, 2007
INVENTOR(S) : Haico Victor Kok et al.

It is certified that error appears in the above-identified patent and that said Letters Patent is hereby corrected as shown below:

In the Claims Col. 16, line 25
  replace "12. The apparatus for determining information relating to"
  with --12. The method for determining information relating to--.

Signed and Sealed this

Eighth Day of December, 2009

David J. Kappos
*Director of the United States Patent and Trademark Office*